United States Patent
Ito

(10) Patent No.: US 8,222,075 B2
(45) Date of Patent: Jul. 17, 2012

(54) NONVOLATILE SEMICONDUCTOR MEMORY DEVICE USING A VARIABLE RESISTANCE FILM AND METHOD OF MANUFACTURING THE SAME

(75) Inventor: Eiji Ito, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 551 days.

(21) Appl. No.: 12/405,890

(22) Filed: Mar. 17, 2009

(65) Prior Publication Data

US 2009/0251940 A1  Oct. 8, 2009

(30) Foreign Application Priority Data

Apr. 4, 2008 (JP) ................ 2008-098595

(51) Int. Cl.
*H01L 21/06* (2006.01)
(52) U.S. Cl. ... 438/103; 438/413; 365/148; 365/185.08; 711/102; 711/103; 430/311; 430/313; 430/314; 430/316; 430/317; 257/2; 257/3; 257/246; 257/379; 257/458; 257/656; 257/613; 257/E21.132; 257/E21.352; 257/E21.662; 257/E21.663; 257/E21.665; 257/E21.679; 257/E45.002; 257/E31.06
(58) Field of Classification Search ............ 257/2, 3, 257/246, 379, 458, 656, 613, E21.132, E21.352, 257/E21.662, E21.663, E21.665, E21.679, 257/E45.002, E31.061, E31.087, E31.088, 257/E33.046, E33.087, E33.088, E29.336, 257/E29.309; 438/103, 413; 365/148, 185.08; 711/2, 103; 430/311, 313, 314, 316, 317

See application file for complete search history.

(56) References Cited

U.S. PATENT DOCUMENTS

| | | | |
|---|---|---|---|
| 2008/0111120 A1* | 5/2008 | Lee et al. | 257/2 |
| 2008/0128853 A1 | 6/2008 | Choi et al. | |
| 2009/0181515 A1* | 7/2009 | Herner et al. | 438/413 |

FOREIGN PATENT DOCUMENTS

| | | |
|---|---|---|
| JP | 2006-295177 | 10/2006 |
| JP | 2006-351779 | 12/2006 |

OTHER PUBLICATIONS

Herner et al.; "Vertical p-i-n Polysilicon Diode With Antifuse for Stackable Field-Programmable ROM", IEEE Electron Device Letters, vol. 25, No. 5, pp. 271-273, (2004).

* cited by examiner

Primary Examiner — Meiya Li
(74) Attorney, Agent, or Firm — Finnegan, Henderson, Farabow, Garrett & Dunner, L.L.P.

(57) ABSTRACT

A plurality of bit lines s arranged crossing a plurality of first word lines. A first diode is arranged at each cross point of the first word lines and the bit lines. A cathode of the first diode is connected to one of the first word lines. A first variable resistance film configuring the first diode is provided between the anodes of the first diodes and the bit lines, and configures a first memory cell together with each of the first diodes, and further, is used in common to the first diodes.

8 Claims, 25 Drawing Sheets

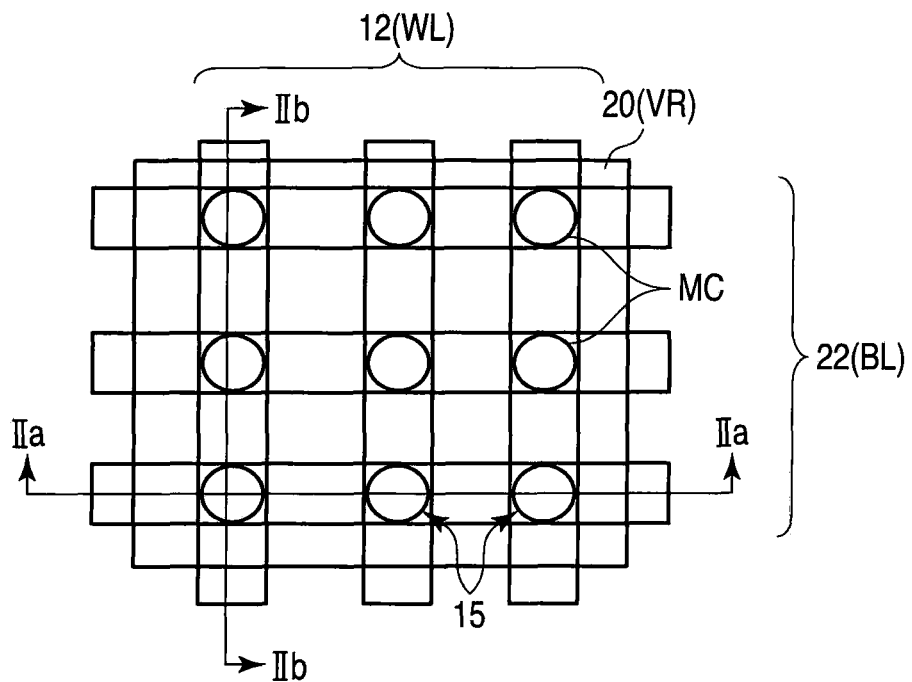
F I G. 1
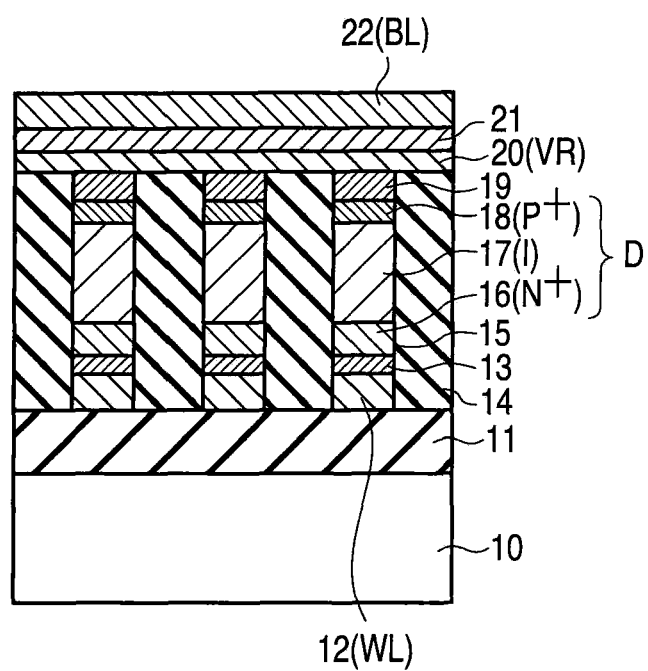
F I G. 2A

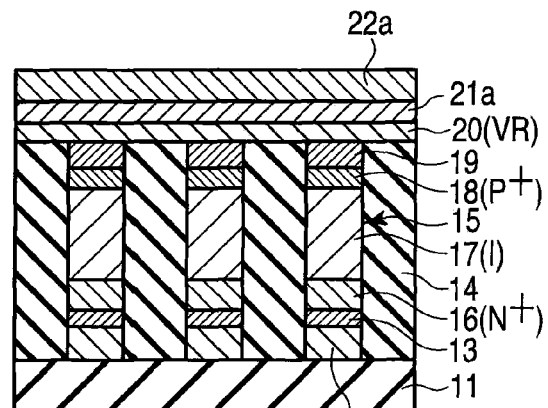
F I G. 18
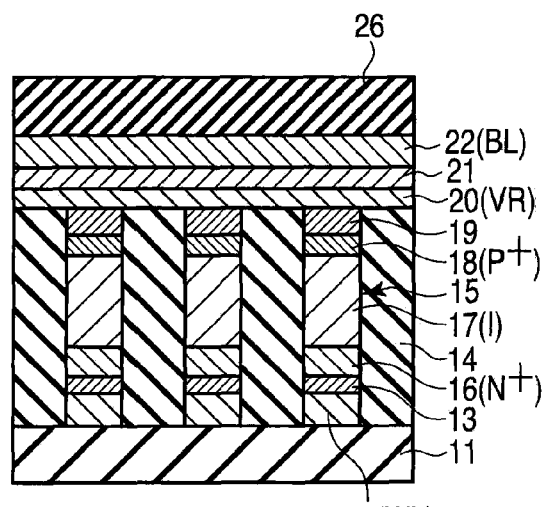
F I G. 19A
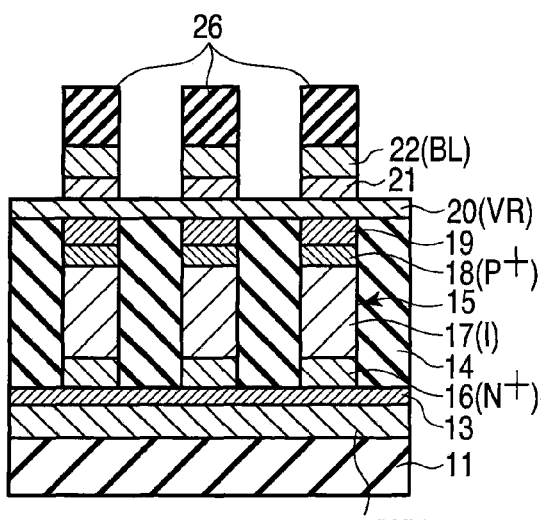
F I G. 19B

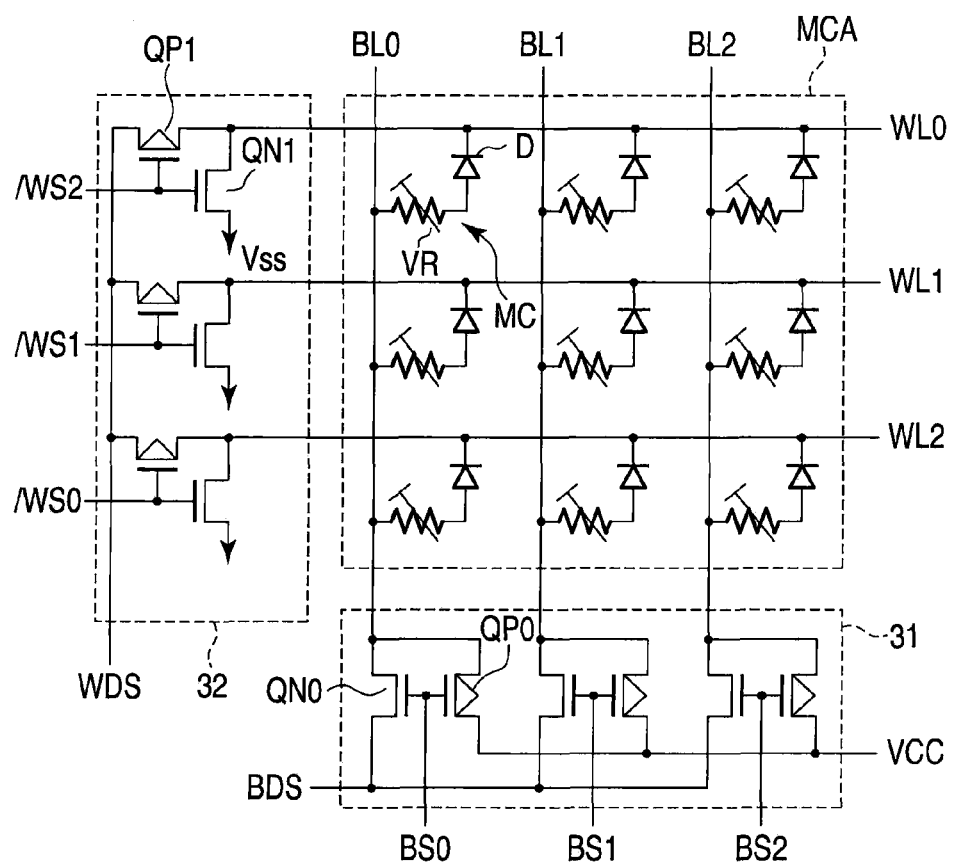
F I G. 20

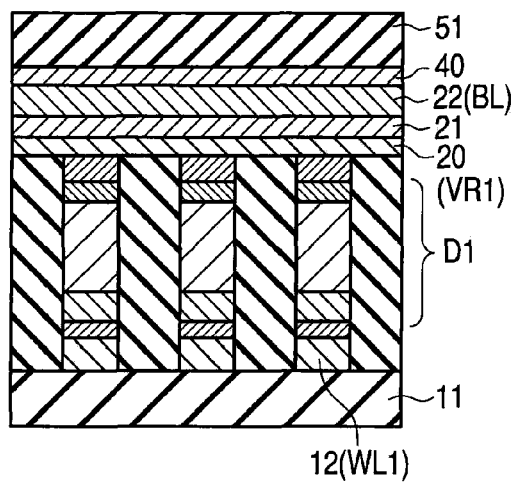
F I G. 24A
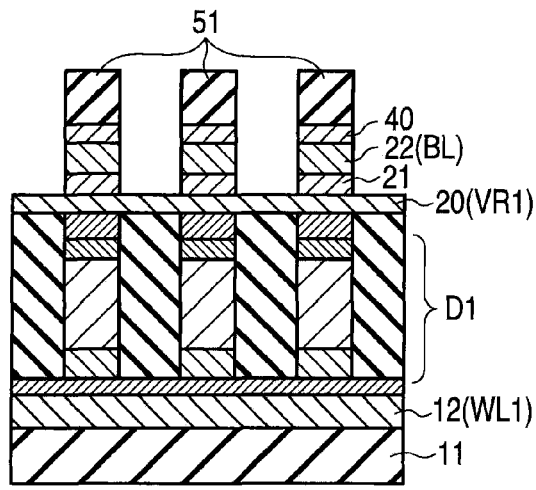
F I G. 24B
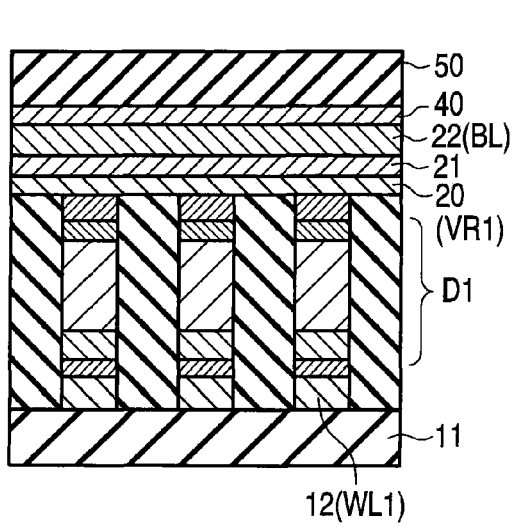
F I G. 25A
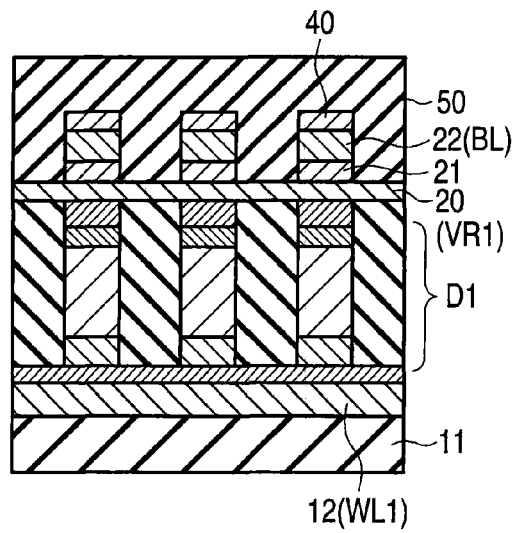
F I G. 25B

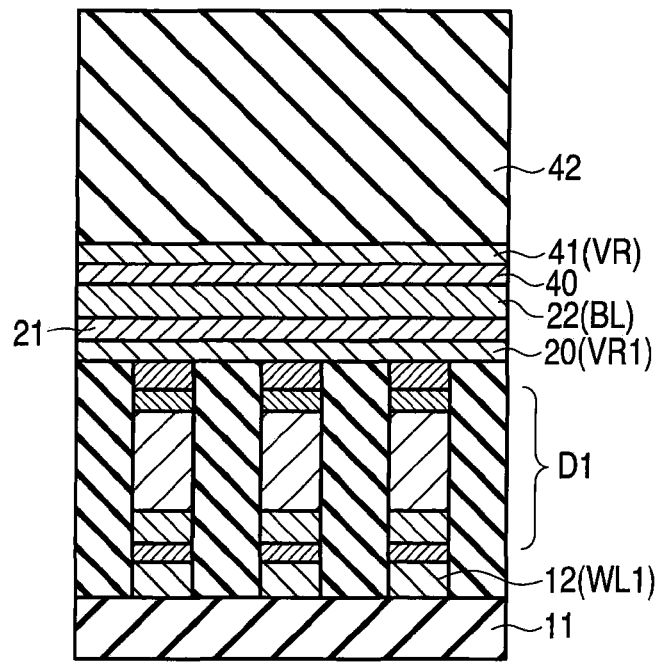
F I G. 28A
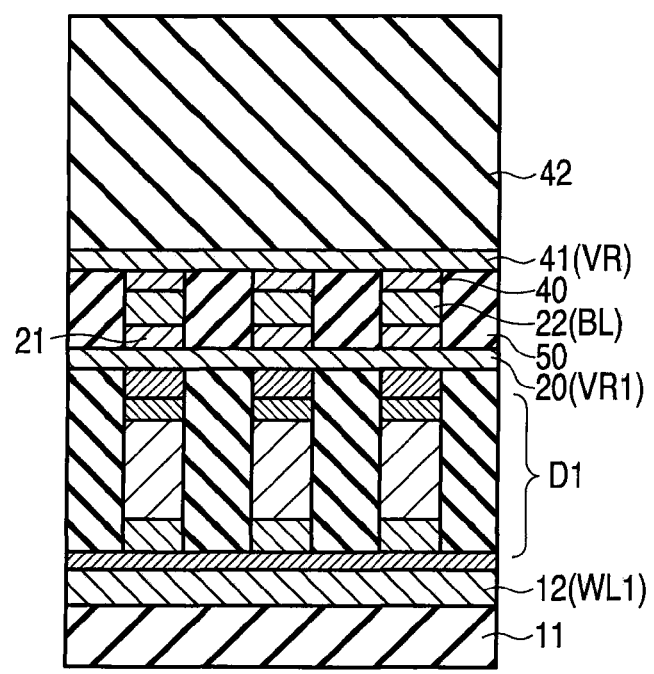
F I G. 28B

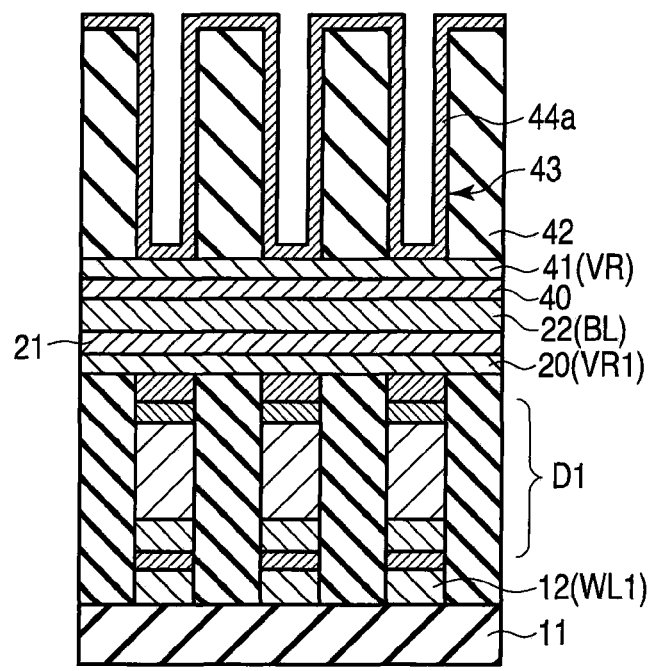
F I G. 30A
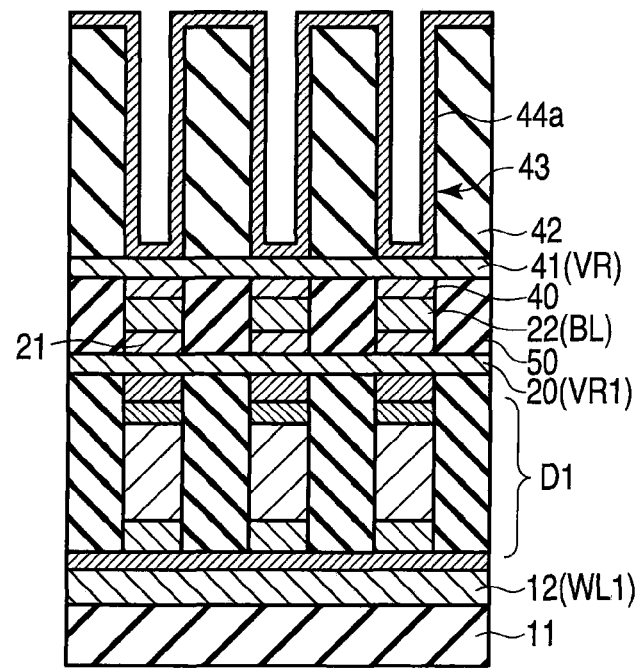
F I G. 30B

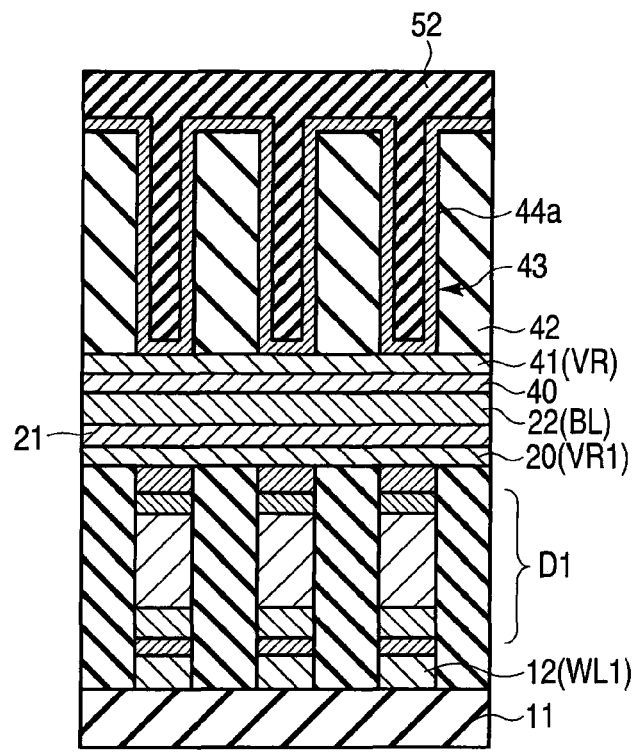
F I G. 31A
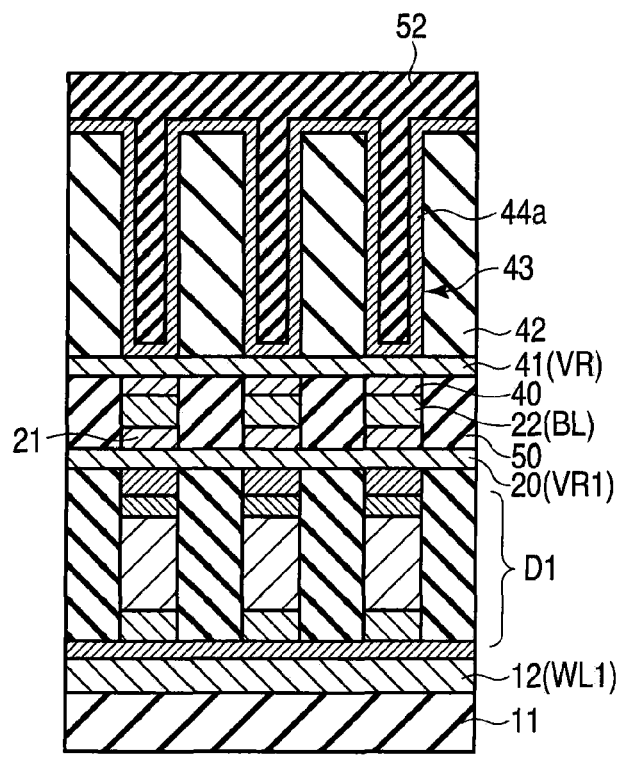
F I G. 31B

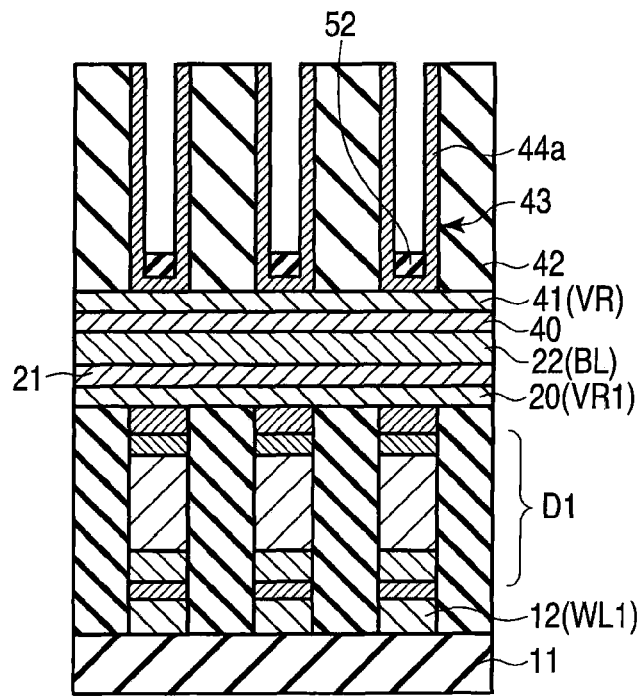
F I G. 33A
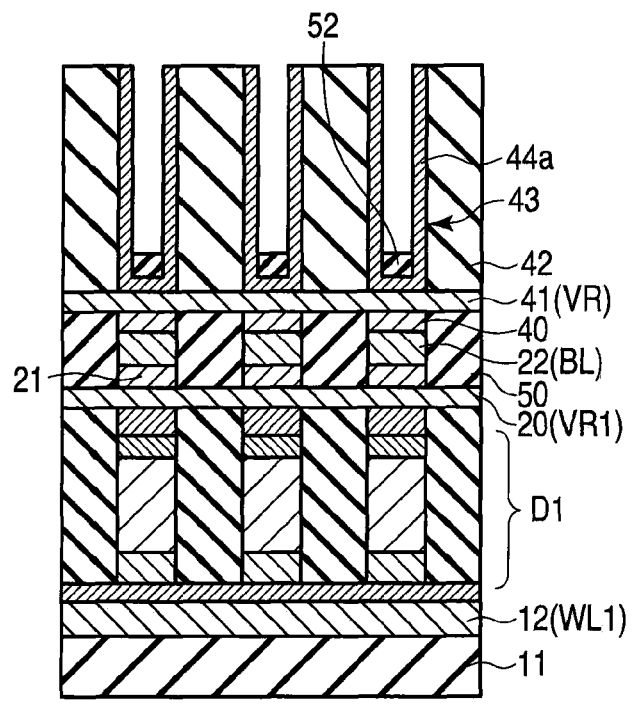
F I G. 33B

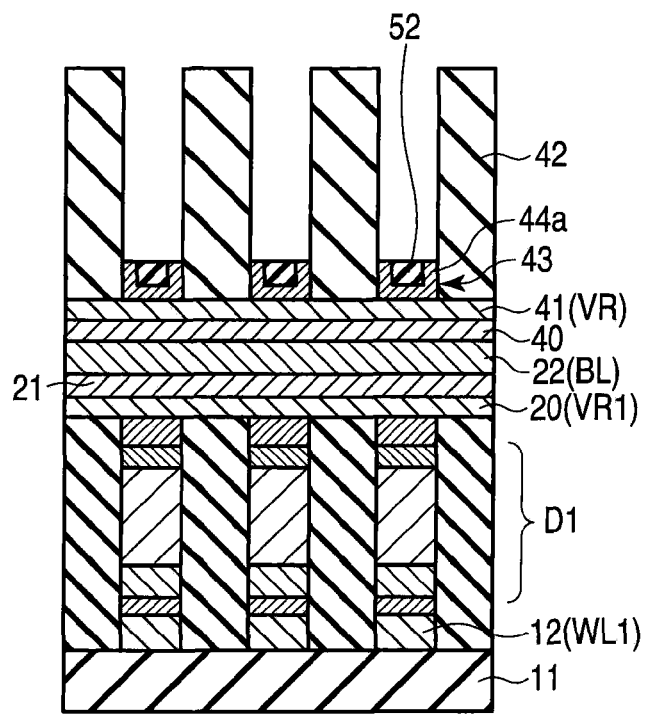
F I G. 34A
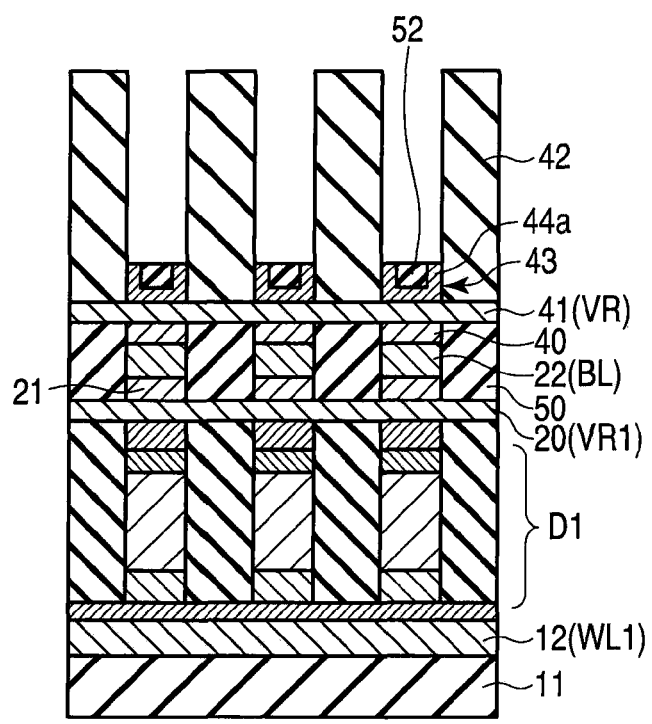
F I G. 34B

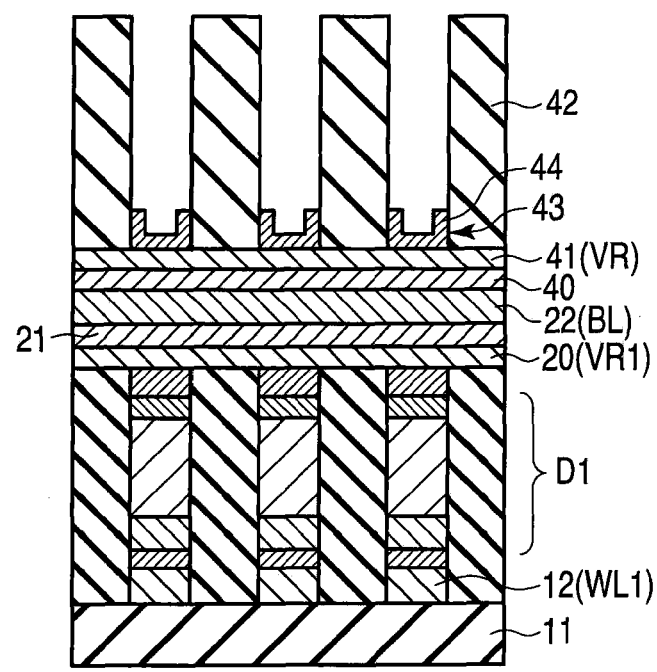
F I G. 35A
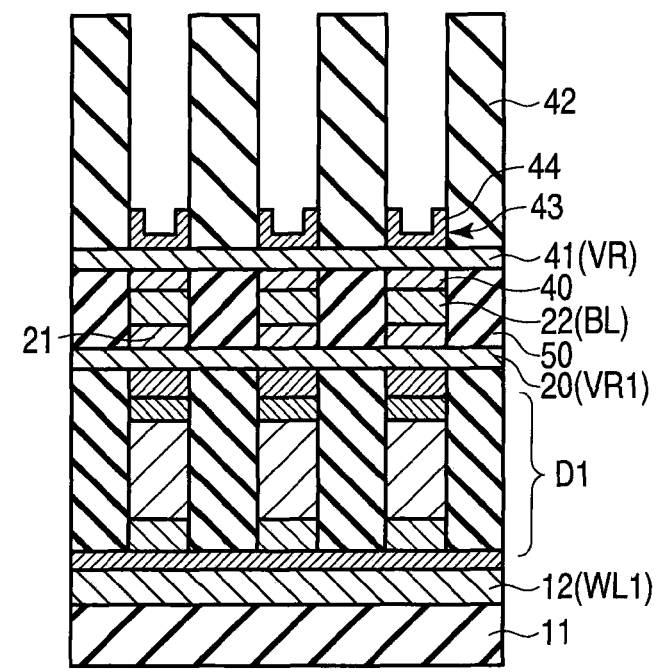
F I G. 35B

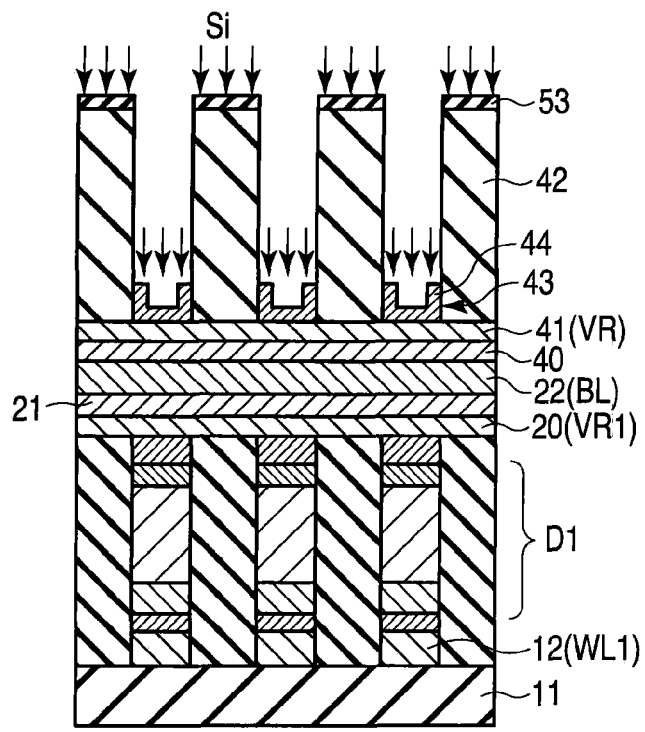
F I G. 36A
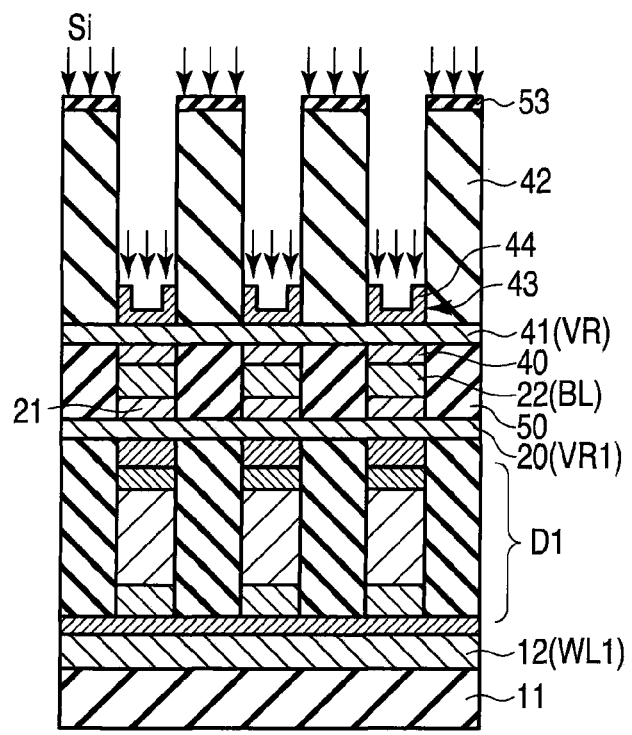
F I G. 36B

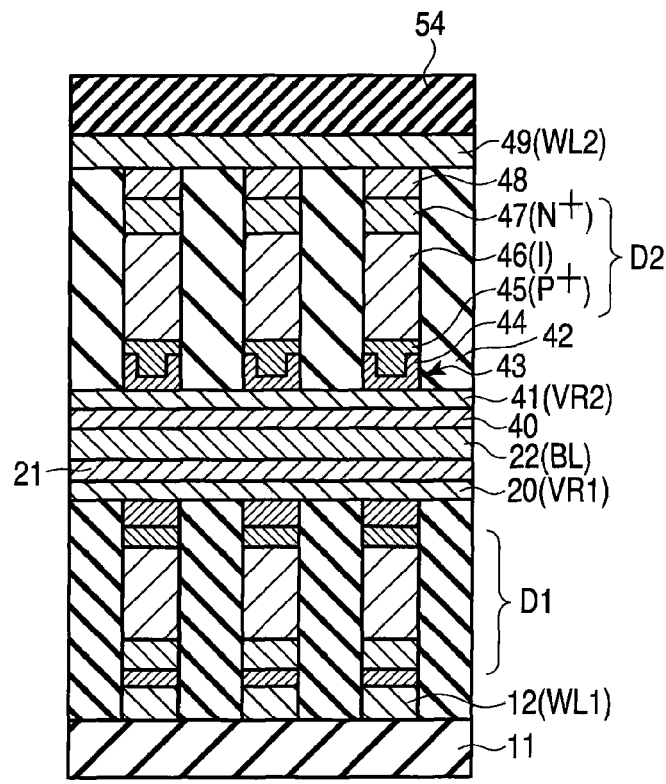
F I G. 38A
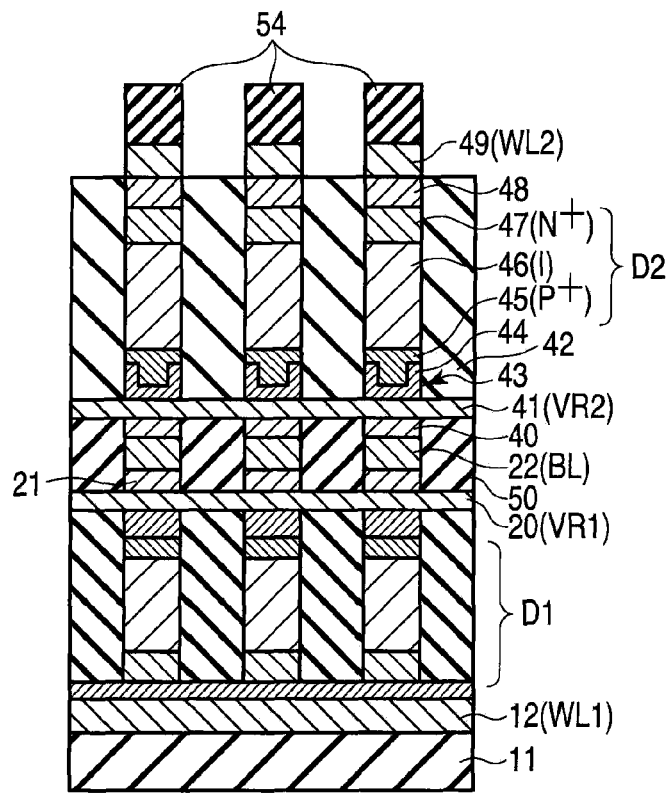
F I G. 38B

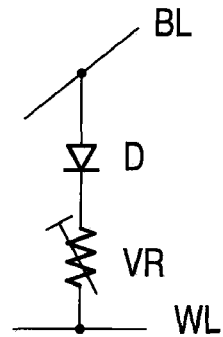
FIG. 39
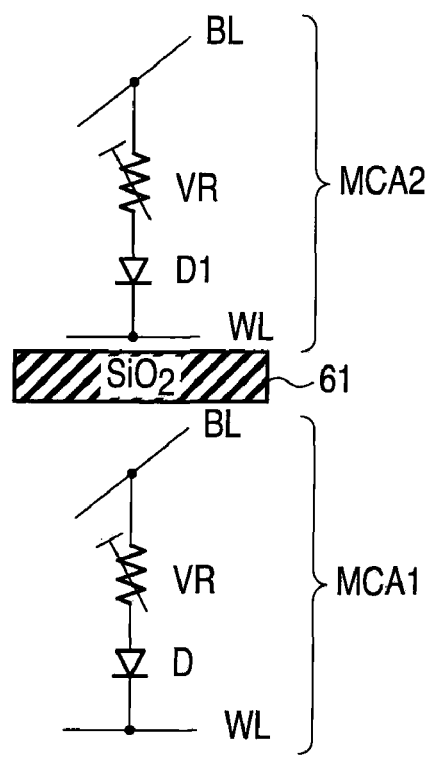 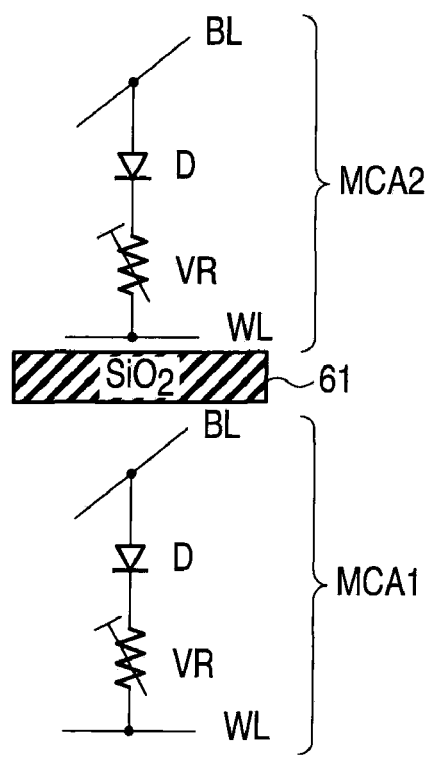
FIG. 40A    FIG. 40B

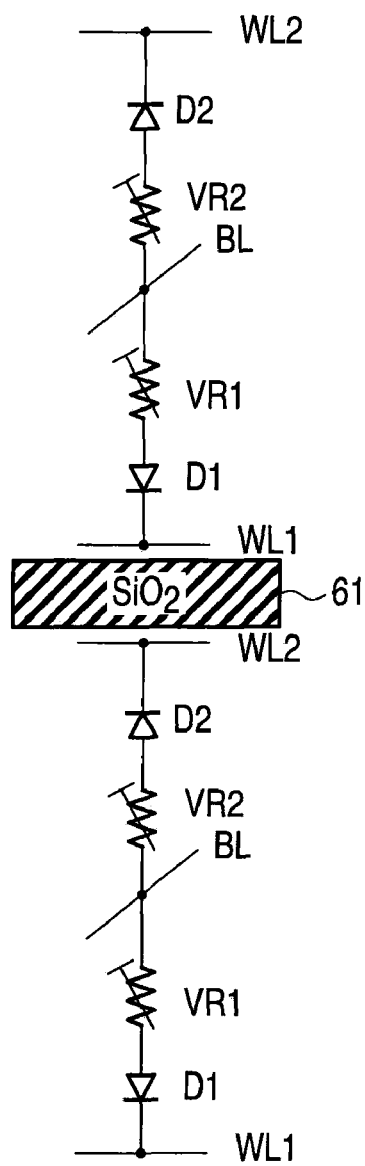
F I G. 41
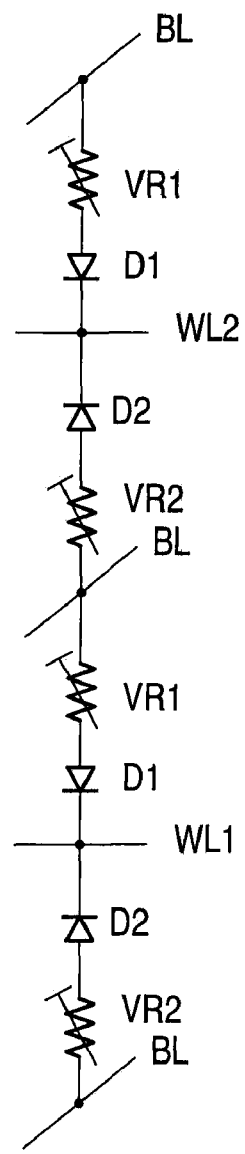
F I G. 42

NONVOLATILE SEMICONDUCTOR MEMORY DEVICE USING A VARIABLE RESISTANCE FILM AND METHOD OF MANUFACTURING THE SAME

CROSS-REFERENCE TO RELATED APPLICATIONS

This application is based upon and claims the benefit of priority from prior Japanese Patent Application No. 2008-098595, filed Apr. 4, 2008, the entire contents of which are incorporated herein by reference.

BACKGROUND OF THE INVENTION

1. Field of the Invention

The present invention relates to a nonvolatile semiconductor memory device using a variable resistance film, and to a method of manufacturing the same.

2. Description of the Related Art

A flash memory has been known as an electrically rewritable nonvolatile memory. Recently, various cross-point cells are developed in order to achieve high performance and scale reduction of a memory cell. A memory cell having the following configuration is developed as one of the cells (e.g., see S. B. Herner et al., "Vertical p-i-n polysilicon diode with Antifuse for Stackable Field-Programmable ROM", IEEE Electron Device Letters, Vol. 25, No. 5, May 2004). According to the configuration of the memory cell, a diode functioning as a rectifier and a fuse formed of an insulating film are series-connected to a cross-point of a bit line and a word line. However, the memory cell is a destruction type cell; for this reason, data is not rewritable.

Various resistive random access memories (ReRAM) are developed as a rewritable cross-point cell. For example, one is an ReRAM configuring a memory cell, which comprises a serial circuit composed of a variable resistance element, a diode and a switching element (e.g., see Jpn. Pat. Appln. KOKAI Publication No. 2006-351779). The other is an ReRAM configuring a memory cell, which comprises a serial circuit composed of a variable resistance element and a diode (e.g., see Jpn. Pat. Appln. KOKAI Publication No. 2006-295177). The ReRAM configuring a memory cell, which comprises a serial circuit composed of a variable resistance element and a diode, has attracted much interest due to the following reason. Namely, a memory cell is arranged at a cross point of a word line and a bit line, and thereby, a cross-point cell array is easily configured.

In order to form a cross-point cell array, a material configuring a diode and a resistive change material configuring a variable resistance element are successively stacked. Thereafter, the materials are patterned using reactive ion etching (RIE) to form a memory cell. In order to secure reverse-bias leak resistance, a diode having a thick film is required taking an elongation of a depletion layer into consideration. For this reason, the memory cell pattern after etching has a high aspect with scale reduction of the device. As a result, there is a problem that the pattern is destroyed.

Further, the following problem arises when etching is carried out using RIE. Specifically, a leak occurs in the side of a top electrode, a diode and a bottom electrode resulting from the interface state of the sidewall of the diode. Furthermore, the following problem arises because the variable resistance element is etched using RIE. Specifically, on the sidewall, a device characteristic is degraded resulting from destruction of the composition and damage by RIE such as dangling bonds. Therefore, it is desired to provide a nonvolatile semiconductor memory device which can prevent characteristic deterioration of a diode and a variable resistance element.

BRIEF SUMMARY OF THE INVENTION

According to a first aspect of the invention, there is provided a nonvolatile semiconductor memory device comprising: a plurality of first word lines: a plurality of bit lines arranged crossing the first word lines; a plurality of first diodes having first and second terminals, and each arranged on a cross point of the first word lines and the bit lines, the first diodes having the first terminal connected to one of the first word lines; and a first variable resistance film provided between the second terminal of the first diodes and the bit lines, the first variable resistance film being common to the first diodes.

According to a second aspect of the invention, there is provided a nonvolatile semiconductor memory device comprising: a plurality of first word lines formed on a first insulating film; a plurality of bit lines formed above the first word lines, the bit lines being formed in a direction crossing the first word lines; a second insulating film formed on the first insulating film and the word lines, the second insulating film having a plurality of first openings to expose the first word lines correspondingly to a cross point of the first word lines and the bit lines; a first conduction-type first semiconductor layer, a first intrinsic semiconductor layer, and a second conduction-type second semiconductor layer, which are formed in each of the first openings, the first semiconductor layer, the first intrinsic semiconductor layer and the second semiconductor layer configuring a first diode; and a first variable resistance film formed between the second insulating film and the bit lines, the first variable resistance film connected in common to the bit lines and the second semiconductor layer formed in the first openings.

According to a third aspect of the invention, there is provided a method of manufacturing a nonvolatile semiconductor memory device, comprising: forming a plurality of first word lines on a first insulating film; forming a second insulating film to cover the first word lines; forming a plurality of first openings to expose the first word lines in the second insulating film, the first openings corresponding to cross points of the first word lines and a plurality of bit lines formed later; forming a first conduction-type first semiconductor layer in each of the first openings; forming a first intrinsic semiconductor layer on the first semiconductor layer in each of the first openings; forming a second conduction-type second semiconductor layer on the first intrinsic semiconductor layer in each of the first openings; forming a first variable resistance film on the entire surface of the second insulating film, the first variable resistance film being connected to the second semiconductor layer in each of the first openings; and forming a plurality of bit lines crossing the first word lines on the first variable resistance film.

BRIEF DESCRIPTION OF THE SEVERAL VIEWS OF THE DRAWING

FIG. 1 is a top plan view showing a nonvolatile semiconductor memory device according to a first embodiment;

FIG. 2A is a cross-sectional view taken along the line IIa-IIa of FIG. 1.

FIGS. 9 to 18 are cross-sectional views showing the process following FIG. 8;

FIGS. 19A and 19B are cross-sectional views showing the process following FIG. 18;

FIG. 20 is a circuit diagram showing the configuration of a nonvolatile semiconductor memory device using a memory cell according to a first embodiment;

FIGS. 24A to 38A and FIGS. 24B to 38B are cross-sectional views showing the process following FIGS. 23A and 23B;

FIG. 39 is an equivalent circuit diagram showing a modification example of a memory cell array;

FIGS. 40A and 40B are equivalent circuit diagrams schematically showing a modification example of the second embodiment;

FIG. 41 is an equivalent circuit diagram schematically showing another modification example of the second embodiment; and FIG. 42 is an equivalent circuit diagram schematically showing another modification example of the second embodiment.

DETAILED DESCRIPTION OF THE INVENTION

Various embodiments of the present invention will be hereinafter described with reference to the accompanying drawings.

First Embodiment

Figure 2B:
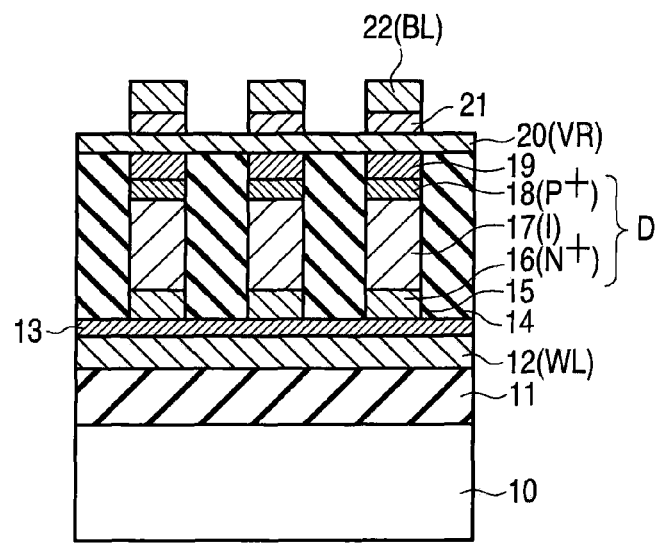
FIG. 2B is a cross-sectional view taken along the line IIb-IIb of FIG. 1.

FIGS. 1, 2A and 2B show the structure of an ReRAM given as a nonvolatile semiconductor memory device according to a first embodiment. In FIGS. 1, 2A and 2B, a MOS transistor (not shown) is formed on a silicon substrate 10. For example, an interlayer insulating film 11 formed of a silicon oxide film is formed on a silicon substrate 10. Then, a memory cell array is formed on the interlayer insulating film 11. The memory cell array includes a plurality of word lines 12 (WL), bit lines 22 (BL) and memory cells MC. The word line 12, bit line 22 and MOS transistor are connected via a contact (not shown) formed in the interlayer insulating film 11. Each memory cell MC is arrayed at a cross point of the word line 12 and the bit line 22. For example, each memory cell MC is composed of a PIN diode (D) and a variable resistance film 20 (VR).

As shown in FIGS. 2A and 2B, a plurality of word lines 12 formed of tungsten (W) are arrayed in parallel on the interlayer insulating film 11. A barrier metal 13 formed of TiN is formed on each word line 12. These word lines 12 are covered with an insulating film 14 formed of a silicon oxide film, for example. The insulating film 14 is formed with an opening 15 correspondingly to a cross point of each word line 12 and the bit line 12. Each opening 15 is formed with a PIN diode D.

The PIN diode D has the following structure. Specifically, an N$^+$ type polysilicon layer 16 is formed on the barrier metal 13. Further, an intrinsic layer 17 is formed on the polysilicon layer 16. Furthermore, a P$^+$ type polysilicon layer 18 is formed on the intrinsic layer 17. The PIN diode D is formed of the polysilicon layers 16, 17 and 18. An electrode 19 of the diode formed of TiN is formed on the polysilicon layer 18.

A variable resistance film 20 (VR) is formed on the diode. The variable resistance film 20 is not divided for each ReRAM by RIE, but formed in common to a plurality of diodes. A portion of the variable resistance film 20 connected to the electrode 19 functions as a variable resistance element. An electrode 21, which functions as a barrier metal and formed of TiN, is formed on the variable resistance film 20 in a direction crossing the word line 12. The bit line 22 is arrayed on the electrode 21 in a direction crossing the word line 12.

(Method of Manufacturing the Device)

FIGS. 3 to 19A and 19B show the process of manufacturing the nonvolatile semiconductor memory device. In FIGS. 3 to 19A and 19B, the same reference numbers are used to designate portions identical to FIGS. 1, 2A and 2B, and the silicon substrate 10 is omitted.

Figure 3:
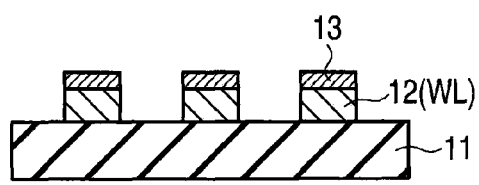
FIG. 3 is a cross-sectional view showing the process of manufacturing a nonvolatile semiconductor memory device according to a first embodiment.

As shown in FIG. 3, a plurality of word lines 12 are formed on an interlayer insulating film 11 using a metal such as tungsten, for example. The word line is formed in such a manner that a tungsten film is etched and a damascene process and chemical mechanical polishing (CMP) are employed. A barrier metal formed of TiN is formed on each word line 12.

Figure 4:
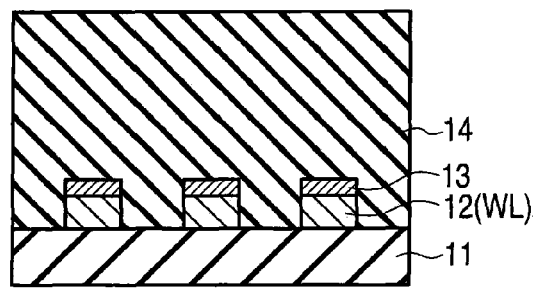
FIGS. 4 to 6 are cross-sectional views showing the process following FIG. 3.

As illustrated in FIG. 4, an insulating film 14 formed of a silicon oxide film is formed on the interlayer insulating film 11. The insulating film 14 is set to have a total thickness equal to a sum of the following thicknesses. One is a film thickness of a plurality of films configuring a diode formed later on the word line 12. Another is a film thickness of an electrode of the diode. Another is a film thickness after polishing by CMP.

Figure 5:
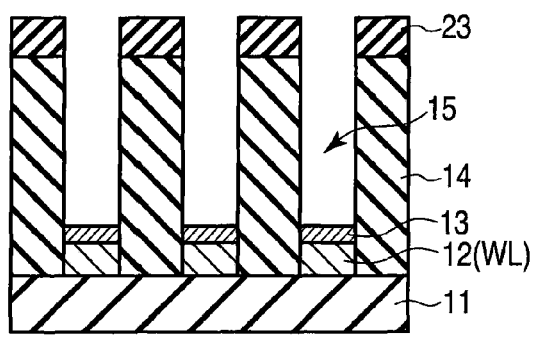

Thereafter, as depicted in FIG. 5, a resist pattern 23 corresponding to a memory cell forming position is formed on the insulating film 14. Then, the insulating film 14 is etched via RIE using the resist pattern 23 as a mask so that a plurality of openings 15 are formed to expose the barrier metal 12. Namely, these openings 15 are formed correspondingly to a cross point of the word line 12 and a bit line 22, formed later.

Figure 6:
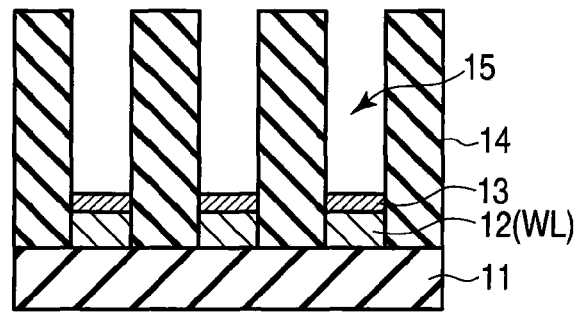

As seen from FIG. 6, the resist pattern 23 on the insulating film 14 is removed via ashing.

Figure 7:
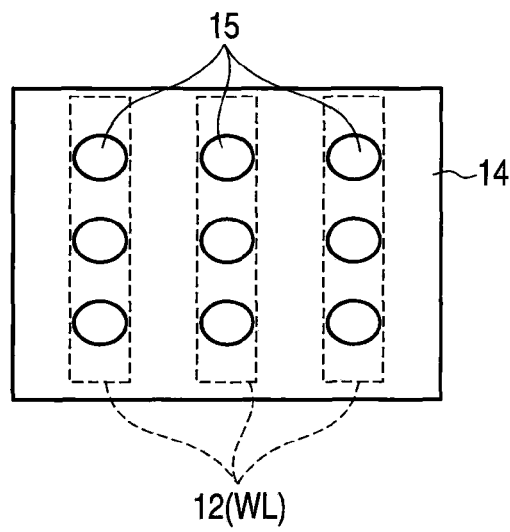
FIG. 7 is a top plan view showing openings shown in FIG. 6.

FIG. 7 shows the relationship between the openings 15 formed on the insulating film and the word line 12.

Figure 8:
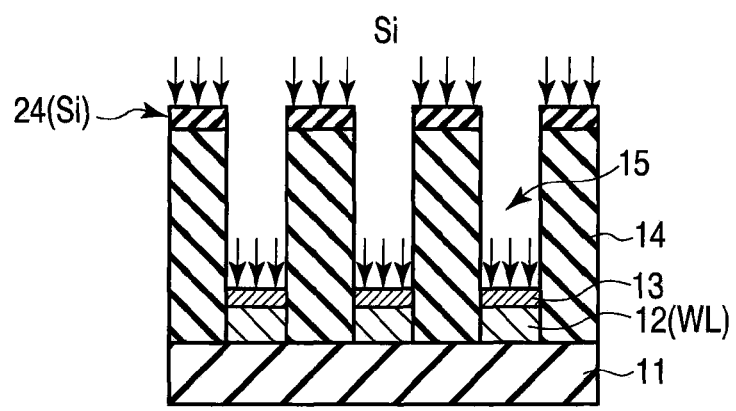
FIG. 8 is a cross-sectional view showing the process following FIGS. 6 and 7.

Thereafter, as shown in FIG. 8, silicon ions are implanted to the entire surface of the substrate. Specifically, silicon ions given as a growth seed are implanted to the word line 12 in order to selectively grow silicon on the tungsten word line 12 formed with the barrier metal. In this case, silicon is implanted to the insulating film 14; therefore, a silicon-rich modified layer 24 to which silicon is implanted is formed on the upper portion of the insulating film.

Figure 9:
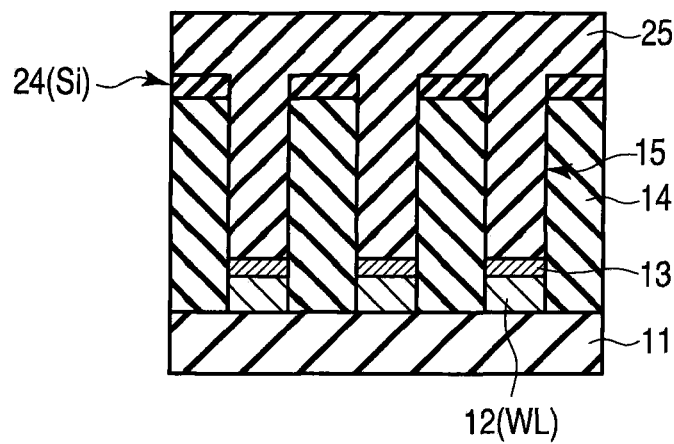

As illustrated in FIG. 9, a resist 25 is coated to the entire surface of the insulating film 15 including the opening 15.

Figure 10:
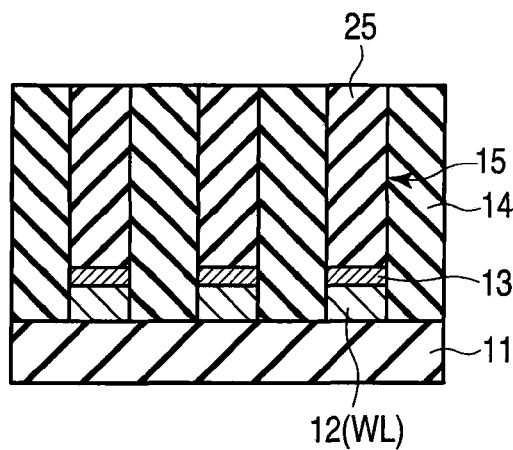

Thereafter, as depicted in FIG. 10, the resist 25 is removed via CMP using the insulating film 14 as a stopper, and simultaneously, the modified layer 24 is also removed.

Figure 11:
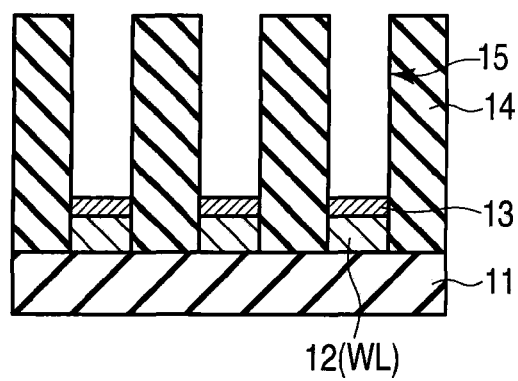

As seen from FIG. 11, the resist filled in the opening 15 is removed using ashing.

Figure 12:
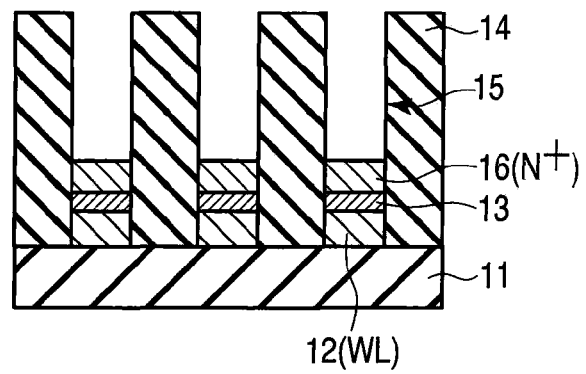

Thereafter, as shown in FIG. 12, silicon is selectively grown on the silicon-rich barrier metal 13 on the word line 12 via chemical vapor deposition (CVD). When silicon is deposited, a gas containing arsenic (As) and phosphorous (P) is supplied, and thereby, the silicon is doped with an impurity. In this way, an N+ type polysilicon layer 16 configuring a diode is formed.

Figure 13:
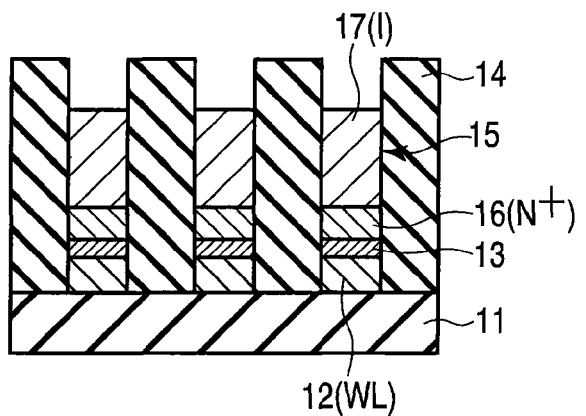

As illustrated in FIG. 13, the supply of the gas containing As and P is stopped to grow silicon, and thereby, a polysilicon intrinsic layer 17 is formed on the N+ type polysilicon layer 16.

Figure 14:
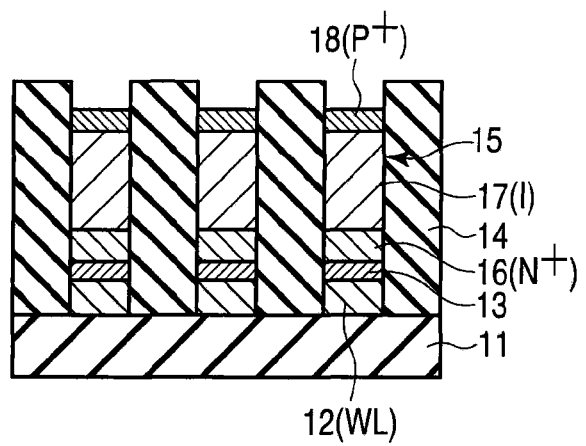

Thereafter, as depicted in FIG. 14, silicon is grown while supplying a gas containing boron (B), and thereby, a P+ type polysilicon layer 18 is formed on the intrinsic layer 17. In this case, deposition is stopped so that the upper surface of the P+ type polysilicon layer 18 is situated at a position lower than the upper surface of the insulating film 14 by 10 to 100 nm, for example. In this way, a PIN diode is formed in the opening 15.

Figure 15:
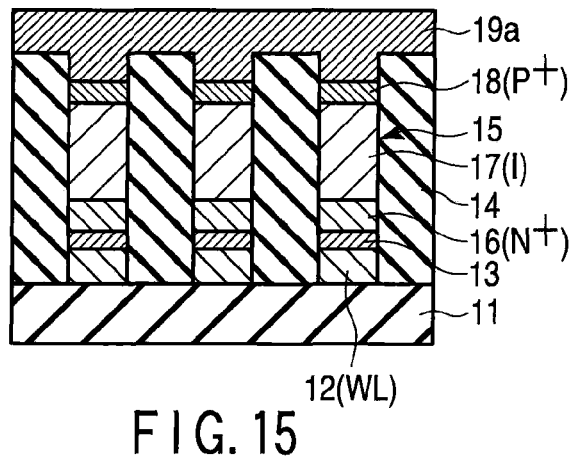

As seen from FIG. 15, for example, a TiN film 19a is formed on the entire surface of the substrate, that is, the insulating film 14 and the P+ type polysilicon layer 18.

Figure 16:
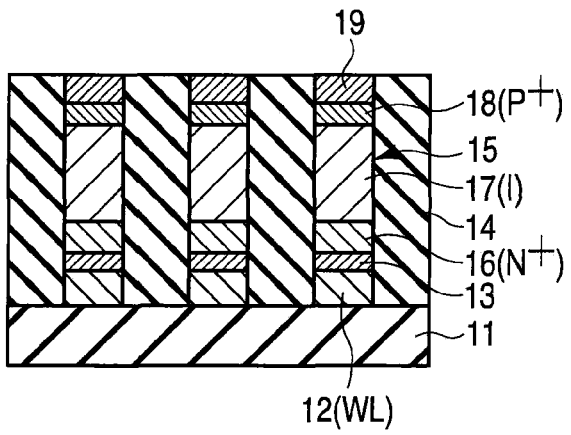

Thereafter, as shown in FIG. 16, the TiN film 19a is planarized via CMP using the insulating film 14 as a stopper. In this way, an electrode 19 of the diode is formed on the P+ type polysilicon layer 18 filled in the opening 15.

Figure 17:
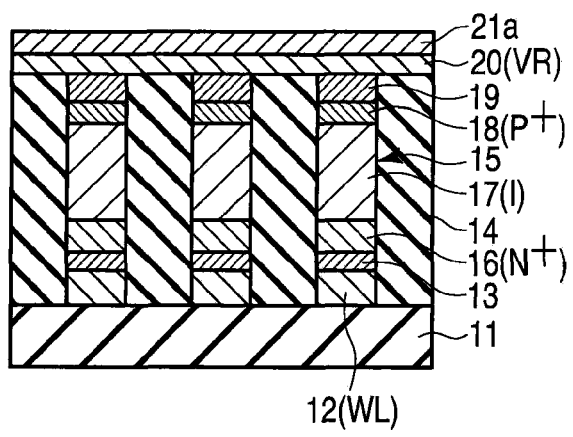

As illustrated in FIG. 17, a variable resistance film 20 is deposited on the entire surface of the substrate, that is, the insulating film 14 and the electrode 19. The following material is used as the variable resistance film 20. The resistance value of the material is changed via current and thermal chemical energy by applying a voltage to the material. The material of the variable resistance film 20 consists of a composite compound having at least two positive ion elements. At least one of the positive ion elements employs a transition element with a d-orbit having insufficient electrons. In addition, the shortest distance between neighboring positive ion elements is set to 0.32 nm or less. Specifically, the material is expressed using a chemical formula AxMyXz (A and M are elements different from each other). For example, the variable resistance film 20 is formed of a material having the following crystal structures. Namely, a spinel structure ($AM_2O_4$), ilmenite structure ($AMO_3$), derafocyto structure ($AMO_2$), $LiMoN_2$ structure ($AMN_2$), wolfflamite structure ($AMO_4$), olibine structure ($A_2MO_4$), horandite structure ($AxMO_2$), ramthderite structure ($AxMO_2$) and perovskite structure ($AMO_3$) are given. A TiN film 21a functioning as an electrode 21 is formed on the variable resistance film 20.

Thereafter, as depicted in FIG. 18, for example, a tungsten film 22a is formed on the TiN film 21a.

As seen from FIGS. 19A and 19B, a resist pattern 26 given as a bit line is formed on the tungsten film 22a. Then, the tungsten film 22a and the TiN film 21a are etched via RIE using the resist pattern 26 as a mask. In this way, the bit line 22 is formed as shown in FIGS. 2A and 2B. In this case, the variable resistance film 20 is not etched via RIE.

It should be note that the materials of the variable resistance film 20, and the electrodes 19 and 21 are not limited to the examples, and modifications may be made.

The minimum dimension between memory cells is determined depending on a breakdown voltage of an insulating film between bit lines. The maximum voltage applied between neighboring cells is about 3V. When an electric field where a silicon oxide film given as the insulating film between bit lines does not generate a leakage is 3 MV/cm, a distance between cells is expressed by the following equation.

3V÷3MV/cm=10nm

Therefore, the minimum design dimension (half pitch) is 10 nm.

The maximum dimension is determined depending on a temperature rise by Joule heat generated by a current flowing from each bit line to a diode. According to simulation, if the cell size is of a 40 nm generation, when a diode is heated by an operation of a bit line, it is estimated that the temperature of the neighboring cell rises by about 100° C. Thus, ten times of 100° C.=1000° C. is set as the critical limit, taking destruction of the cell itself into consideration. Joule heat is proportional to current squared, that is, cell sectional area squared. For this reason, a current is carried through the cell to cause the temperature to rise to 1000° C. In this case, assuming that the sectional shape of the cell is a square, one side length is expressed by the following equation.

$(40 \times 40 \times (1000/100)^{1/2})^{1/2} = 71$nm

However, the temperature rise simulation is based on a general calculation, and the optimal value of the maximum design dimension is approximately 100 nm.

According to the first embodiment, one variable resistance film 20 is provided with respect to a plurality of diodes so that a memory cell is composed of the variable resistance film 20 and a diode. Thus, the variable resistance film 20 is not formed using RIE; as a result, it is possible to prevent the generation of damage such as dangling bonds on the sidewall of a device. Therefore, this serves to prevent degradation of a device characteristic.

Further, the insulating film 14 is formed with the opening 15. The N+ type polysilicon layer 16, intrinsic layer 17 and P+ type polysilicon layer configuring the PIN diode is grown and formed in the opening 15. Therefore, even if the aspect ratio of the diode is high, there is no destruction of the pattern.

Furthermore, there is a problem that the pattern dimension of the diode is thinned when the insulating film is filled between cells after a conventional PIN diode is formed into a pillar shape using RIE. However, according to this embodiment, it is possible to prevent the pattern dimension of the diode from being thinned. Therefore, this serves to make large a forward current of the diode.

Further, the diode is not formed using RIE; therefore, the interface level formed on the sidewall of the diode is reduced. As a result, this serves to reduce interface leakage.

Furthermore, the resistance change material film is not etched using RIE, so that the sidewall of the diode is not formed with a damage layer by RIE. Therefore, this serves to prevent degradation of the variable resistance characteristic, and thus, to prevent a device characteristic from being degraded.

FIG. 20 shows one example of the circuit configuration of a nonvolatile semiconductor memory device using the memory cell of the first embodiment. In FIG. 20, the same reference numerals are used to designate portions identical to FIG. 1 and FIG. 2.

In a memory cell array MCA, a cathode of a diode D configuring each memory cell is connect to word lines WL0 to WL2. An anode of the diode D is connected to bit line BL0 to BL2 via a variable resistance element VR. One terminal of each of the bit lines BL0 to BL2 is connected to a select circuit 31 configuring a part of a column control circuit. One terminal of each of the word lines WL0 to WL2 is connected to a select circuit 32 configuring a part of a row control circuit 32.

The select circuit 31 is composed of a PMOS transistor QP0 and an NMOS transistor QN0 provided for each of the bit lines BL0 to BL2. The gate and drain of the PMOS transistor QP0 and NMOS transistor QN0 are connected in common. The source of the PMOS transistor QP0 is connected to a high-potential power supply Vcc. The source of the NMOS transistor QN0 is connected to a bit line drive sense line BDS.

The bit line drive sense line BDS applies a write pulse in a write operation, and simultaneously, carries a current to be detected in a data read operation. The common drains of the transistors QP and QN0 are each connected to the bit lines BL0 to BL2. Bit line select signals BS0 to BS2 for selecting the bit lines BL0 to BL2 are supplied to the common gate.

The select circuit 32 is composed of a PMOS transistor QP1 and an NMOS transistor QN1 provided for each of the word lines WL0 to WL2. The gate and drain of the PMOS transistor QP1 and NMOS transistor QN1 are connected in common. The source of the PMOS transistor QP1 is connected to a word line drive sense line WDS. The word line drive sense line BDS applies a write pulse in a write operation, and simultaneously, carries a current to be detected in a data read operation. The source of the NMOS transistor QN1 is connected to a low-potential power supply Vss. The common drain of the PMOS transistor QP1 and the NMOS transistor QN1 is connected to the word lines WL0 to WL2. The common gate is supplied with word line select signals /WS0 to /WS2 for selecting each of word lines WL0 to WL2.

FIG. 20 shows a circuit example suitable for individual selection of the memory cell. However, if data of memory cells connected to the selected word line WL is collectively read, a sense amplifier is independently arranged with respect to each of bit lines BL0 to BL2. Each of the bit lines BL0 to BL2 is independently connected to a sense amplifier via the select circuit 31 according to bit line select signals BS0 to BS2.

Second Embodiment

The first embodiment relates to the memory cell array given as a one-layer structure nonvolatile semiconductor memory device in which the memory cell is arranged at a cross point of the word line and the bit line. On the contrary, the second embodiment relates to a two-layer structure memory cell array. Namely, the memory cell array of the second embodiment has the following structure. Specifically, a second memory cell array having the same structure as the memory cell array shown in the first embodiment and having a bit line is provided above the memory cell array shown in the first embodiment (first memory cell array).

Figure 21A:
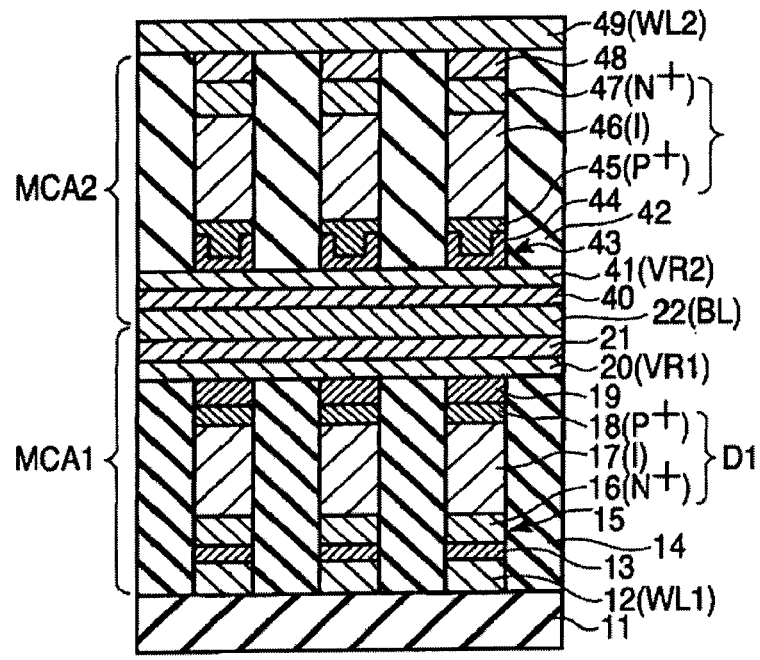
FIGS. 21A and 21B are cross-sectional views showing a nonvolatile semiconductor memory device according to a second embodiment.
Figure 21B:
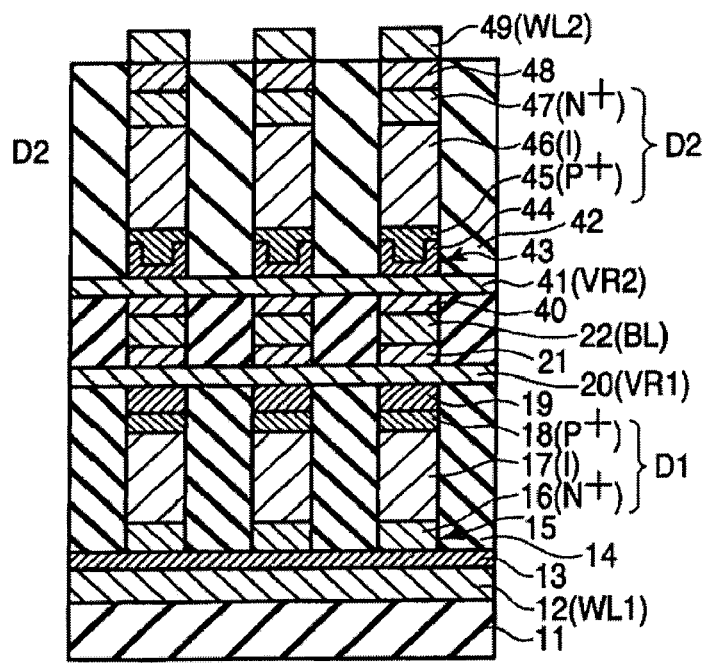
Figure 22:
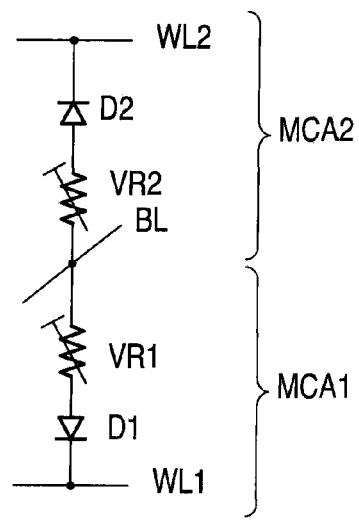
FIG. 22 is an equivalent circuit diagram showing a part of the nonvolatile semiconductor memory device according to a second embodiment.

FIGS. 21A and 21B show the structure of a nonvolatile semiconductor memory device according to a second embodiment. FIG. 22 shows an equivalent circuit of the device shown in FIG. 21. In FIGS. 21 and 22, the same reference numerals are used to designate portions identical to the first embodiment.

As seen from FIGS. 21A, 21B and 22, a second memory cell array MCA2 is provided above a first memory cell array MCA1. An electrode 13 is provided on each of a plurality of first word lines (WL1). An insulating film 14 is provided on the electrode 13, and the insulating film 14 is formed with a plurality of openings 15. Each of the openings 15 is arranged correspondingly to a cross point of the first word lines 12 (WL1) and a plurality of bit lines 22 (BL). Each of the openings 15 is provided with a first diode D1. The first diode D1 is a PIN diode, and composed of an $N^+$ layer 16, an intrinsic layer 17 and a $P^+$ layer 18. A first variable resistance film (VR1) is provided on the first diode D1 via an electrode 19. A plurality of bit lines 22 (BL) are provided on the first variable resistance film 20 (VR1) via an electrode 21.

In the second memory cell array MCA2, an electrode 40 is provided on each of the bit lines 22. A second variable resistance film 41 (VR2) is provided on the electrode 40. A second insulating film 42 is formed on the second variable resistance film 41. The second insulating film 42 is formed with a plurality of openings 43. The openings 43 are provided correspondingly to a cross point of the bit lines 22 and a plurality of second word line 49 (WL2) arranged orthogonal thereto. The second opening 43 is provided with a concave-shaped electrode 44, which is used as a barrier metal connected to the second variable resistance film 41 (VR2). Further, the second opening 43 is provided with a second diode D2. The second diode D2 is a PIN diode, for example, and composed of a $P^+$ layer 45, an intrinsic layer 46 (I) and an $N^+$ layer 47. An electrode 48 is provided on each of the second diodes D2, and a plurality of word lines (WL) are provided on each of these electrodes.

(Method of Manufacturing the Device)

FIGS. 23A and 23B to 37A and 37B show the process of manufacturing a nonvolatile semiconductor memory device according to a second embodiment. According to the second embodiment, the method of forming the first memory cell array MCA1 is the same as the first embodiment. However, a process after the electrode on the first variable resistance film 20 is formed is different from the first embodiment.

Figure 23A:
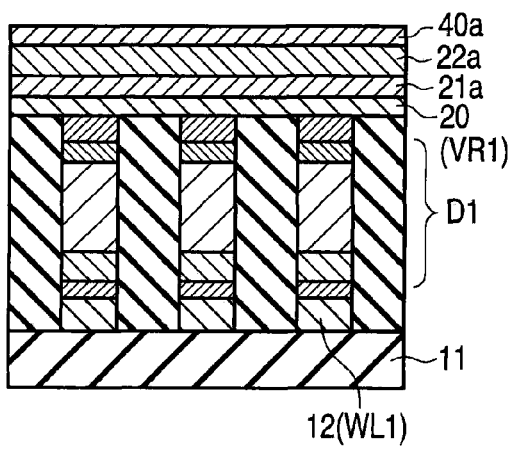
FIGS. 23A and 23B are cross-sectional views showing the process of manufacturing a nonvolatile semiconductor memory device according to a second embodiment.
Figure 23B:
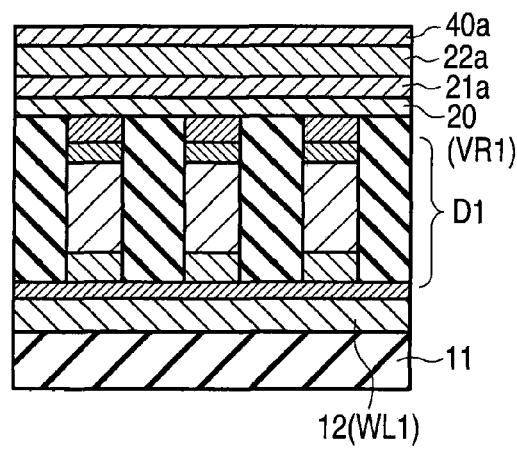

As shown in FIGS. 23A and 23B, for example, a TiN film 21a, a tungsten film 22a and a TiN film 40a are successively deposited on the first variable resistance film 20.

Thereafter, as illustrated in FIGS. 24A and 24B, a resist 51 is coated so that the resist 51 has a pattern correspond to the bit line. The TiN film 21a, tungsten film 22a and TiN film 40a are etched using the patterned resist 51 as a mask, and thereby, a plurality of electrodes 21, bit lines 22 (BL) and electrodes 40 are formed.

As depicted in FIGS. 25A and 25B, an insulating film 50 is formed on the first variable resistance film 20 so that the insulating film 50 is filled between the bit lines 22. For example, a silicon oxide film is used as the insulating film 50. The silicon oxide film is formed to cover the first variable resistance film 20 and the bit line 22 via CVD.

Figure 26A:
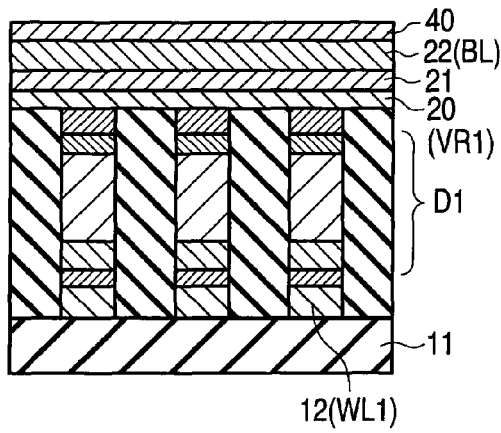
Figure 26B:
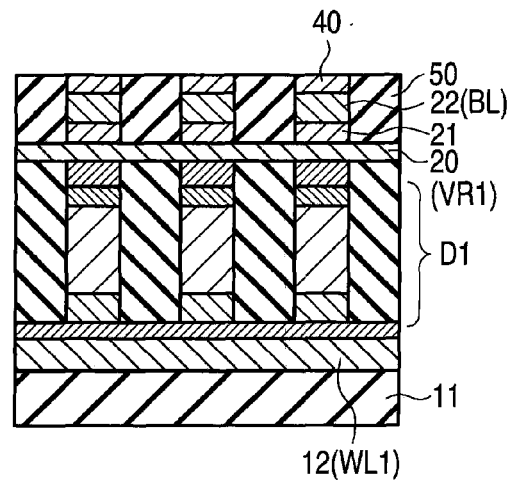

Thereafter, as seen from FIGS. 26A and 26B, the silicon oxide film is planarized via CMP using the TiN film 40 as a stopper. In this way, the insulating film 50 is formed.

Figure 27A:
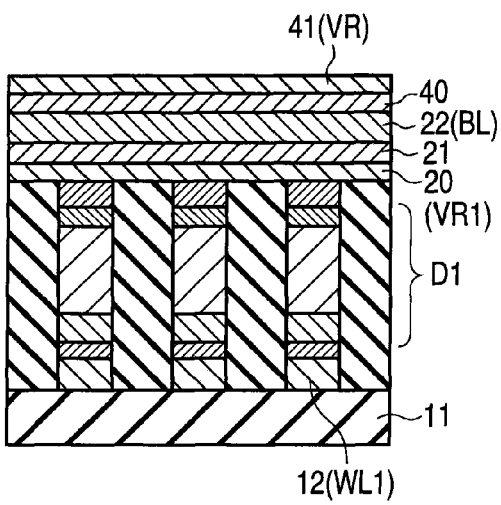
Figure 27B:
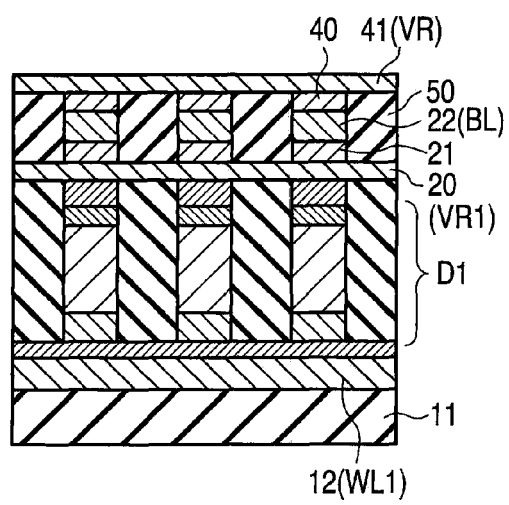

As shown in FIGS. 27 and 27B, a second variable film 41 is formed on a plurality of the TiN films 40 and the insulating films 50. The material of the second variable resistance film 41 is the same as the first variable resistance film 20.

As illustrated in FIGS. 28A and 28B, a second insulating film 42 is formed on the second variable resistance film 41. The second insulating film 42 is set to a total thickness equal to a sum of the following thicknesses, like the first insulating film 14. One is a film thickness of a plurality of films configuring the second diode. Another is a film thickness of electrodes formed at both ends of the second diode. Another is a film thickness after polishing by CMP.

Figure 29A:
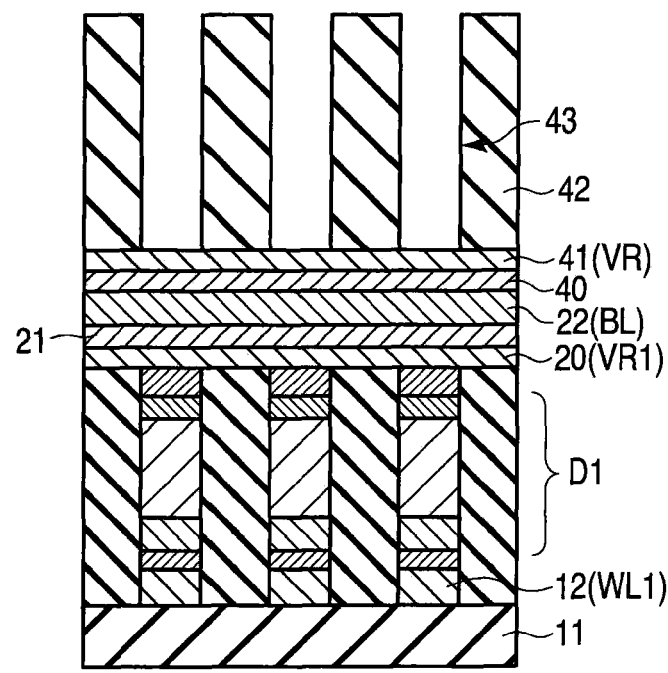
Figure 29B:
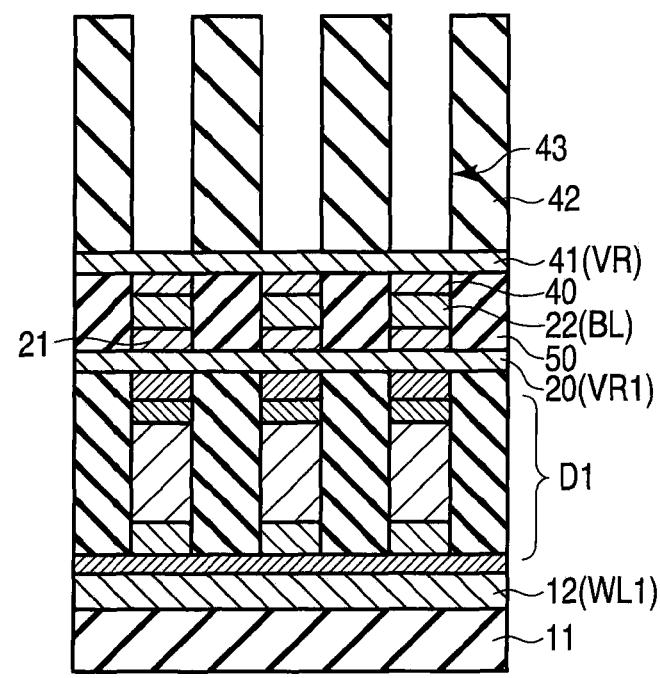

Thereafter, as depicted in FIGS. 29A and 29B, the second insulating film 42 is etched to form a plurality of second openings 43 for exposing the second variable resistance film 41. The second openings 43 are formed correspondingly to a cross point of a plurality of bit lines 22 and a plurality of word lines formed later.

As seen from FIGS. 30A and 30B, the second openings 43 are formed with a TiN film 44a using physical vapor deposition (PVD). The TiN film 44a has a film thickness of about 20 nm, for example.

Thereafter, as shown in FIGS. 31A and 31B, the second openings 43 are filled with a resist 52.

Figure 32A:
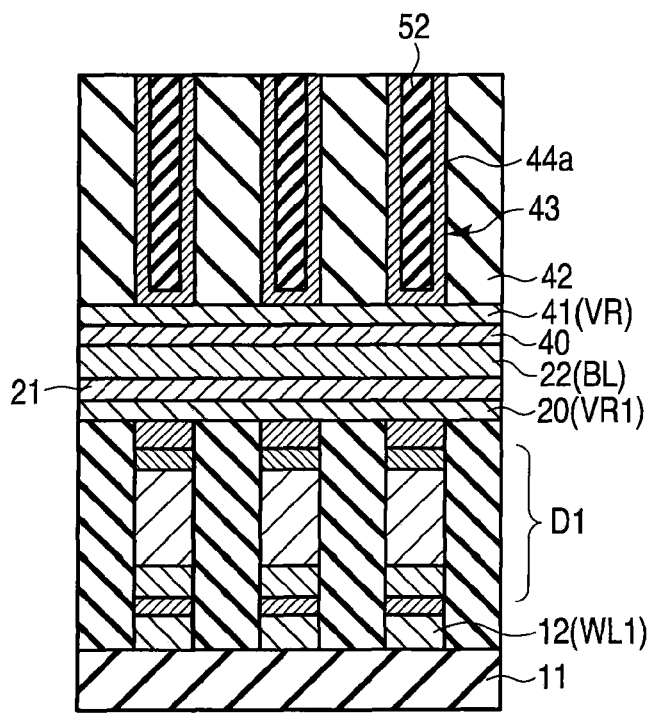
Figure 32B:
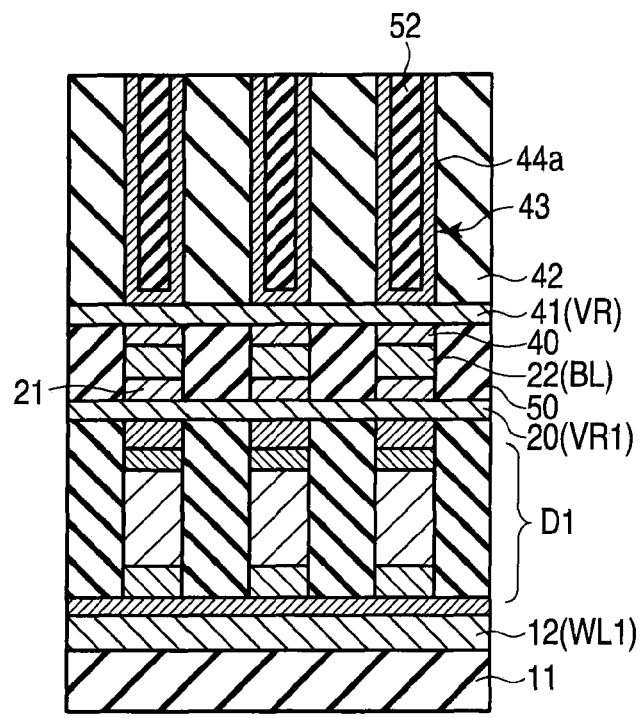

As illustrated in FIGS. 32A ad 32B, the resist 52 and the field TiN film 44a are removed via CMP using the second insulating film 42 as a stopper.

Thereafter, as depicted in FIGS. 33A and 33B, the resist 52 filled in the second opening 43 is etched back using photolithography, chemical dry etching (CDE) and RIE. In this case, the resist 52 is left to have a film thickness of 10 to 30 nm from the surface of the TiN film 44a formed on the bottom portion of the second opening 43.

As seen from FIGS. 34A and 34B, the TiN film 44a formed at the sidewall of the second opening 43 is selectively removed using CDE, for example. In this way, the TiN film is left as a concave-shaped electrode 44 at the bottom portion only of the second opening 43.

Thereafter, as shown in FIGS. 35A and 35B, the resist remaining in the second opening 43 is fully removed using ashing.

As illustrated in FIGS. 36A and 36B, silicon (Si) ions are implanted to the electrode 44. In this case, a silicon-rich modified layer 53 is formed on the surface of the second insulating film 42.

Figure 37A:
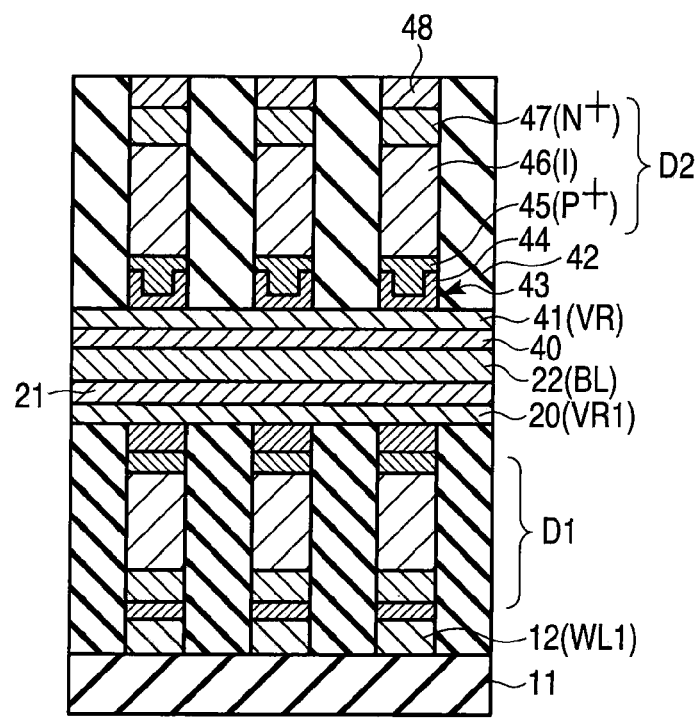
Figure 37B:
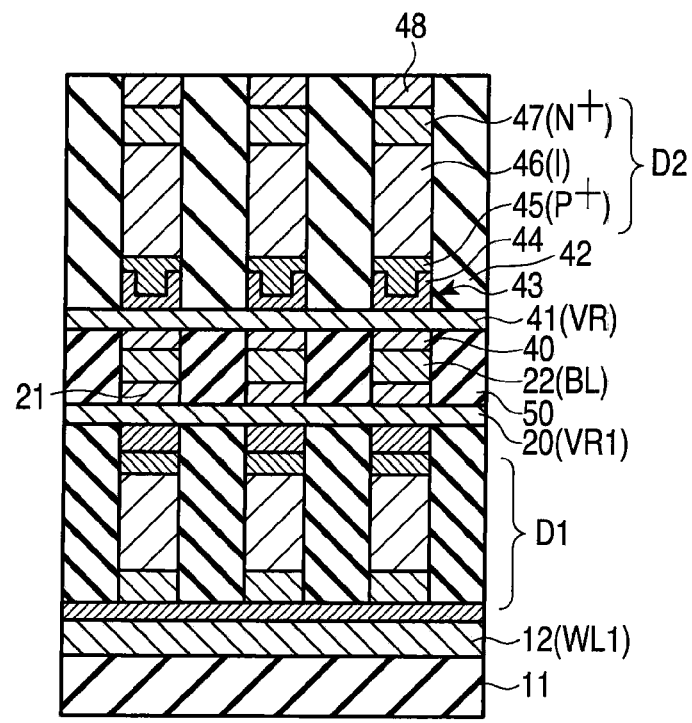

As depicted in FIGS. 37A and 37B, the modified layer 53 on the second insulating film 42 is removed by CMP, for example. Thereafter, a second diode D2 is formed in the second opening 43. Specifically, silicon is selectively grown on the silicon-rich electrode 44 via CVD. When the silicon is deposited, the silicon is grown while a gas containing boron (B) is supplied, and thereby, a $P^+$ type polysilicon layer 45 is formed. Then, the supply of boron is stopped to grow silicon, and thereby, an intrinsic layer 46 is formed on the $P^+$ type polysilicon layer 45. Thereafter, a gas containing arsenic (As) and phosphorous (P) is supplied to silicon, and thereby, an $N^+$ type polysilicon layer 47 is formed on the intrinsic layer 46. The deposition of the $N^+$ type polysilicon layer 47 is stopped so that the upper surface is situated at a position lower than the upper surface of the second insulating film 42 by 10 to 100 nm, for example. In this way, the second (PIN) diode D2 is formed in the second opening 43. For example, a TiN film is deposited on the entire surface of the second insulating film 42, and then, the TiN film on the second insulating film 42 is removed using CMP. In this way, an electrode 48 formed of the TiN film is formed in the second opening.

Thereafter, as seen from FIGS. 38A and 38B, a plurality of second word lines 49 (WL2) crossing the bit lines are formed on the second insulating film 42. Specifically, for example, a tungsten film is formed on the entire surface of the second insulating film 42, and then, a resist 54 is formed on the tungsten film. The resist 54 is patterned to correspond to the word line. Then, the tungsten film is etched using the patterned resist 54, and in this way, a plurality of word lines 49 are formed.

According to the second embodiment, the first and second memory cell arrays MCA1 and MCA2 are stacked sharing a plurality of bit lines 22 (BL). Therefore, it is possible to mount an ReRAM having the first diode D1, the first variable resistance layer 20 (VR1), the second diode D2 and the second variable resistance layer 41 with high density.

In addition, the first and second diodes D1 and D2 are formed in the first and second openings 15 and 43 formed on the first and second insulating films 14 and 42, respectively. Therefore, there is no need to form the first and second diodes D1 and D2 using etching. This serves to prevent the first and second diodes D1 and D2 from being destroyed even if the first and second diodes D1 and D2 have a high aspect ratio.

Further, there is no need to form the first and second diodes D1 and D2 using etching. This serves to avoid the following disadvantage; specifically, the first and second diodes D1 and D2 do not receive damage due to etching. Therefore, it is possible to prevent deterioration of a device characteristic.

Further, the bit lines are shared in the first and second memory cell arrays MCA1 and MCA2, and thereby, the number of interconnects are formed by the minimum number of the number of cell layers +1. Therefore, the process of manufacturing the device is simplified.

Further, the diode configuring the memory cell is left like a pillar, and thereafter, an insulating film is filled between the cells. In this case, the $N^+$ type polysilicon layer configuring the diode is thinned in its dimension. However, according to the second embodiment, it is possible to prevent the $N^+$ type polysilicon layer from being thinned when the polysilicon layers configuring the first and second diodes D1 and D2 are grown in the first and second openings 15 and 43. Therefore, it is possible to increase a forward current of the first and second diodes D1 and D2.

Further, the electrode 44 is formed into a concave (recess) shape. This serves to increase a contact area with the $P^+$ layer 45 configuring the diode compared with the case where the electrode 44 is formed into a flat shape. Therefore, it is possible to effectively radiate heat generated from the diode.

FIG. 39 shows a modification example of the present invention. According to the first and second embodiments, the variable resistance film VR is interposed between the diode D and the bit line BL. As seen from FIG. 39, the variable resistance film VR may be interposed between the diode D and the word line WL. Even if the configuration is provided, the same effect as the first embodiment is obtained.

FIG. 40 schematically shows a modification example of the second embodiment. According to the second embodiment, the bit line is used in common to the first and second memory cell arrays. However, the second embodiment is not limited to the configuration.

FIG. 40A shows the case where double use is made of the cell structure shown in the first embodiment. For example, an insulating film 61 formed of a silicon oxide film is provided on the first memory cell array MCA1, and further, the second memory cell array MCA2 is formed on the insulating film 61.

FIG. 40B shows the case where double use is made of the memory cell array shown in FIG. 39. For example, an insulating film 61 formed of a silicon oxide film is provided on the first memory cell array MCA1, and further, the second memory cell array MCA2 is formed on the insulating film 61.

FIG. 41 shows another modification example of the second embodiment. For example, double use is made of the memory cell array shown in FIG. 22. Specifically, an insulating film 61 formed of a silicon oxide film is provided between two stacked memory cell arrays. In this case, three or more memory cell arrays may be stacked.

FIG. 42 shows another modification example of the second embodiment. According to this modification example, stacked memory cell arrays mutually share a word line or bit line. According to the configuration, the insulating film 61 between memory cell arrays is omitted, unlike the modification example shown in FIG. 41. According to the configuration, three or more memory cell arrays may be stacked.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a nonvolatile semiconductor memory device, comprising:
    forming a plurality of first word lines on a first insulating film;
    forming a second insulating film to cover the first word lines;

forming a plurality of first openings to expose the first word lines in the second insulating film, the first openings corresponding to cross points of the first word lines and a plurality of bit lines formed later;

forming a first conduction-type first semiconductor layer in each of the first openings;

forming a first intrinsic semiconductor layer on the first semiconductor layer in each of the first openings;

forming a second conduction-type second semiconductor layer on the first intrinsic semiconductor layer in each of the first openings;

forming a first variable resistance film on the entire surface of the second insulating film, the first variable resistance film being connected to the second semiconductor layer in each of the first openings; and forming the plurality of bit lines crossing the first word lines on the first variable resistance film.

2. The method according to claim 1, further comprising:

forming a second variable resistance film on the bit lines;

forming a third insulating film on the second variable resistance film;

forming a plurality of second openings to expose the second variable resistance film in the third insulating film, the second openings corresponding to cross points of the bit lines and a plurality of second word lines formed later;

forming a second conduction-type third semiconductor layer in each of the second openings;

forming a second intrinsic semiconductor layer on the third semiconductor layer in each of the second openings;

forming a first conduction-type fourth semiconductor layer on the second intrinsic semiconductor layer in each of the second openings; and forming the plurality of second word lines crossing the bit lines, the second word lines being connected to the fourth semiconductor layer in each of the second openings.

3. The method according to claim 2, further comprising:

forming an electrode between the third semiconductor layer and the second variable resistance film in the second openings, the electrode having a concave shape.

4. The method according to claim 2, wherein the second variable resistance film is formed on the entire surface of the bit lines.

5. The method according to claim 1, wherein the first semiconductor layer, the first intrinsic semiconductor layer and the second semiconductor layer are formed using vapor phase growth.

6. The method according to claim 2, wherein the third semiconductor layer, the second intrinsic semiconductor layer and the fourth semiconductor layer are formed using vapor phase growth.

7. The method according to claim 1, wherein the first conduction-type first semiconductor layer is formed by depositing a silicon doped with an impurity, and then the first intrinsic semiconductor layer is formed by stopping the impurity and depositing the silicon.

8. The method according to claim 1, wherein the first variable resistance film comprises a composite compound having at least two positive ion elements.

* * * * *